United States Patent
Hiroi et al.

(10) Patent No.: US 11,788,973 B2
(45) Date of Patent: Oct. 17, 2023

(54) DEFECT INSPECTION DEVICE AND DEFECT INSPECTION METHOD

(71) Applicant: Hitachi High-Tech Corporation, Tokyo (JP)

(72) Inventors: Takashi Hiroi, Tokyo (JP); Nobuaki Hirose, Tokyo (JP); Takahiro Urano, Tokyo (JP)

(73) Assignee: Hitachi High-Tech Corporation, Tokyo (JP)

( * ) Notice: Subject to any disclaimer, the term of this patent is extended or adjusted under 35 U.S.C. 154(b) by 344 days.

(21) Appl. No.: 17/285,537

(22) PCT Filed: Oct. 16, 2019

(86) PCT No.: PCT/JP2019/040545
§ 371 (c)(1),
(2) Date: Apr. 15, 2021

(87) PCT Pub. No.: WO2020/105319
PCT Pub. Date: May 28, 2020

(65) Prior Publication Data
US 2021/0381989 A1    Dec. 9, 2021

(30) Foreign Application Priority Data
Nov. 19, 2018  (JP) .................. 2018-216212

(51) Int. Cl.
*G01N 21/95* (2006.01)
*G01N 21/88* (2006.01)
(Continued)

(52) U.S. Cl.
CPC ..... *G01N 21/9501* (2013.01); *G01N 21/8851* (2013.01); *G01N 21/956* (2013.01);
(Continued)

(58) Field of Classification Search
CPC . G01N 2021/8887; G01N 2021/95676; G01N 21/8851; G01N 21/9501;
(Continued)

(56) References Cited

U.S. PATENT DOCUMENTS

| | | |
|---|---|---|
| 2007/0035728 A1 | 2/2007 | Kekare et al. |
| 2016/0061749 A1 | 3/2016 | Chen et al. |

(Continued)

FOREIGN PATENT DOCUMENTS

| | | |
|---|---|---|
| JP | 5-218159 A | 8/1993 |
| JP | 7-27708 A | 1/1995 |

(Continued)

OTHER PUBLICATIONS

International Search Report (PCT/ISA/210) issued in PCT Application No. PCT/JP2019/040545 dated Dec. 17, 2019 with English translation (four (4) pages).

(Continued)

*Primary Examiner* — Tri T Ton
(74) *Attorney, Agent, or Firm* — Crowell & Moring LLP

(57) ABSTRACT

The purpose of this invention is to make it possible to efficiently and accurately detect a reticle defect at an earlier stage in a manufacturing process. The inspection device according to this invention uses the results of comparing die images of wafers that have had patterns transferred thereto using the same reticle after subjecting the die images to averaging processing and the results of comparing the die images without subjecting the same to averaging processing to distinguish a random defect signal caused by a huge defect, or the like, and having an extremely high brightness from a repeated defect signal, and only extracts repeated defects with higher accuracy.

10 Claims, 13 Drawing Sheets

(51) Int. Cl.
*G01N 21/956* (2006.01)
*G06T 7/00* (2017.01)

(52) U.S. Cl.
CPC .... *G06T 7/0006* (2013.01); *G01N 2021/8887* (2013.01); *G01N 2021/95676* (2013.01); *G06T 2207/30148* (2013.01)

(58) Field of Classification Search
CPC .......... G01N 21/956; G01N 21/95607; G01N 21/95684; G03F 1/84; G06T 2207/30148; G06T 7/0006; G06T 7/0004; G06T 7/001
USPC ...................... 356/237.1–237.6, 239.1–239.8
See application file for complete search history.

(56) References Cited

U.S. PATENT DOCUMENTS

2018/0130199 A1     5/2018   Brauer et al.
2020/0072763 A1*   3/2020   Suman ............. G01N 21/95607

FOREIGN PATENT DOCUMENTS

JP           11-87443 A     3/1999
JP           2007-41600 A    2/2007

OTHER PUBLICATIONS

Japanese-language Written Opinion (PCT/ISA/237) issued in PCT Application No. PCT/JP2019/040545 dated Dec. 17, 2019 (three (3) pages).

\* cited by examiner

DEFECT INSPECTION DEVICE AND DEFECT INSPECTION METHOD

TECHNICAL FIELD

The present invention relates to a technology of inspecting a wafer to which a pattern is transferred from a reticle and thereby inspecting a defect that the reticle has.

BACKGROUND ART

In a case of forming a circuit pattern on a semiconductor wafer, the pattern is transferred onto the wafer by a photolithography process using, for example, a photomask (there are also cases where it is called a reticle) and thereafter the circuit pattern is formed via processes such as etching and so forth. There exists an inspection device which extracts a reticle-induced defect from the reticle itself on this occasion. However, it becomes difficult to inspect the reticle itself and to detect a Killer defect due to changes in condition of an exposure device and in reticle material, a reduction in size of a critical defect and so forth in association with refinement. Therefore, it is requested to detect the reticle-induced defect not on the reticle itself but on the wafer onto which the reticle is transferred.

On the wafer onto which the pattern is transferred from the reticle, there exist a random defect which generates randomly and a repeated defect which is repeated exactly at the same positions in dies, striding over a plurality of semiconductor chips (dies). The latter is the reticle-induced defect. In a case where a defect is present on the reticle itself, that reticle-induced defect is transferred onto the wafer. Since the reticle is transferred at equal intervals, when the wafer is inspected after the transfer concerned, the reticle-induced repeated defects are detected at the equal intervals and at the same positions in the dies.

In a case where it is wished to extract only the reticle-induced defect from the wafter to which they are transferred, it becomes necessary to segregate it from a not reticle-induced defect. For example, in a case of Patent Literature 1, in order to segregate the reticle-induced defect, a group of defect candidates is obtained on an early stage of an inspection with a proper threshold so as not overlook weak reticle induced defect signal. As the result, the candidates include many noise defects. A method of segregating whether each defect candidate is induced by the reticle defect from information on the group of defect candidates also at a later stage of the inspection is disclosed.

PRIOR ART LITERATURE

Patent Literature

Patent Literature 1: US Patent Publication No. US2018/0130199A1

SUMMARY OF INVENTION

Technical Problem

In Patent Literature 1, "hot threshold" is defined as "a threshold used for detecting potential defects and defects that is set intentionally at or substantially near the noise floor of the images generated by the scanning". In addition, ""Hot scans" performed using a hot threshold are typically performed to detect as many potential defects and actual defects as possible to ensure that the most defects or all of the interesting defects are captured and/or to ensure that defects having relatively weak signals are captured." is described. In Patent Literature 1, the group of defect candidates is extracted with a threshold on the basis of which all very weak defect signals which are equivalent to the noise region in level are picked up. Accordingly, the firstly acquired group of defect candidates is in a state of intentionally including many noises. In defect inspection, in general, an ordinary threshold is requested to wishfully detect true defects as many as possible and, on the other hand, to minimize the noise. However, in Patent Literature 1, a system of extracting information on defect candidates which are in a state of including many noises, without intentionally minimizing the noise is disclosed. However, the number of defect candidates is greatly increased by the system of collecting a wide range of defect candidate images once at the early stage of the inspection in Patent Literature 1.

In Patent Literature 1, it is desirable to set the threshold low at the early stage of the inspection. However, a larger number of defect candidate groups is detected as the threshold is lowered and a data capacity to be retained is increased. Since a retainable volume of a storage medium is limited (regardless of whether it is installed in or outside the inspection device) and a processing time is elongated as the data capacity is increased (even when a processing method is improved), it is unavoidable to gain the threshold (a sensitivity) which depends on it. At the later stage of the inspection, arithmetic processing for repeated defect extraction is performed on the huge number of defect candidate images in order to extract the repeated defect. However, the lower the threshold which is set at the early stage of the inspection is, the more the defect candidate data capacity is increased and the more the processing time which is taken at the later stage of the inspection is elongated. Accordingly, it is imagined that an issue still remains in processing time which is taken until detection of the repeated defect and the sensitivity by the method of Patent Literature 1. In addition, in Patent Literature 1, nothing is disclosed and indicated as to how a random defect which has very strong signals such as huge particle and so forth which strides over a plurality of dies is distinguished from a signal of the repeated defect. An issue still remains also in this point.

The present invention performs the inspection on the wafer to which the reticle is transferred and extracts only the reticle-induced repeated defect. In Patent Literature 1, two-stage processing that at the early stage of the inspection, the threshold is set once and the defect candidate group which includes the repeated defect and the random defect is extracted, and the repeated defect is extracted by processing on the defect candidate information, the defect image is disclosed. The present invention extracts the repeated defect directly by processing for a raw image (a swath image) which is firstly obtained in the inspection. It aims to provide a technology of making it possible to detect the defect that the reticle has efficiently and accurately without caring about a trade-off relation between an amount of images which are acquired at the first stage and the processing time or the sensitivity as in Patent Literature 1. In addition, a signal which is very intense in brightness such as a huge defect and so forth is distinguished from a signal of the repeated defect and only the repeated defect is extracted highly accurately. Nothing is referred thereto in Patent Literature.

Solution to Problem

In reticle defect detection systems, an inspection subsystem which detects a repeated defect as a reticle defect from a swath image that a wafter to which a reticle is transferred is imaged, a reticle defect detection system which includes a stage which holds the wafer and moves in an XY direction, an image acquisition unit which acquires the swath image by scanning the wafer and an processing unit which performs processing on the swath image and in which the processing unit divides the swath image into die images, additively averages die images of the same transfer regions that the same parts of the reticle in the swath image are transferred and generates averaged images, calculates first defect information which is obtained by performing die-TO-die comparison between the averaged images, calculates second defect information which is obtained by performing die-TO-die comparison between original die images which are not averaged in the swath image, and compares the first defect information with the second defect information on the same coordinates and extracts only the repeated defect by sorting out or excluding a case where the second defect information is large is provided.

Advantageous Effects of the Invention

An inspection device according to the present invention can decide presence/absence of the reticle defect in line by using the image that the wafer which is transferred to the wafer by the reticle is imaged and can feed it back to a production line. In addition, averaging processing is directly executed on a raw image (the swath image) and the repeated defect is extracted by die-To-die comparison between acquired averaged die images. A noise level can be lowered, only Signal of the repeated defect can be emphasized and a Signal/Noise rate can be heightened by directly performing the averaging processing on the raw image. The repeated defect can be detected with a threshold which conforms to the-die-To-die between the averaged die images. That is, detection of the repeated defect is possible at a sensitivity which is higher than that of such a system that the defect candidates are extracted by ordinary die-To-die and then only the repeated defect is extracted. Further, the present invention makes it possible to sort out the repeated defect from the random defect that Signal is originally strong such as the huge particle and so forth. A result of decision by die-To-die comparison that original die images which are not averaged are used is used therefor. The random defect and the repeated defect can be distinguished from each other highly accurately by using results of decision of the die-To-die comparison between the averaged die images and the die-To-die comparison between the original die images which are not averaged in combination. Since the averaging processing and die-To-die comparison processing are directly performed from the swath image, there is no need to temporarily store a huge amount of defect candidate information and detection of even a weak repeated defect becomes possible in a short processing time and at the high sensitivity, without caring about data capacity-based limitations. Incidentally, this processing may be performed by shot-To-shot comparison in place of the die-To-die comparison. In addition, since the number of defects which are detected by the die-To-die comparison using the averaged images is limited to only the repeated defect and the huge random defect even under a condition which has a sufficient sensitivity, the repeated defect and the huge random defect can be identified from a very small number of defect candidates.

DESCRIPTION OF EMBODIMENTS

Embodiment 1

Figure 1:
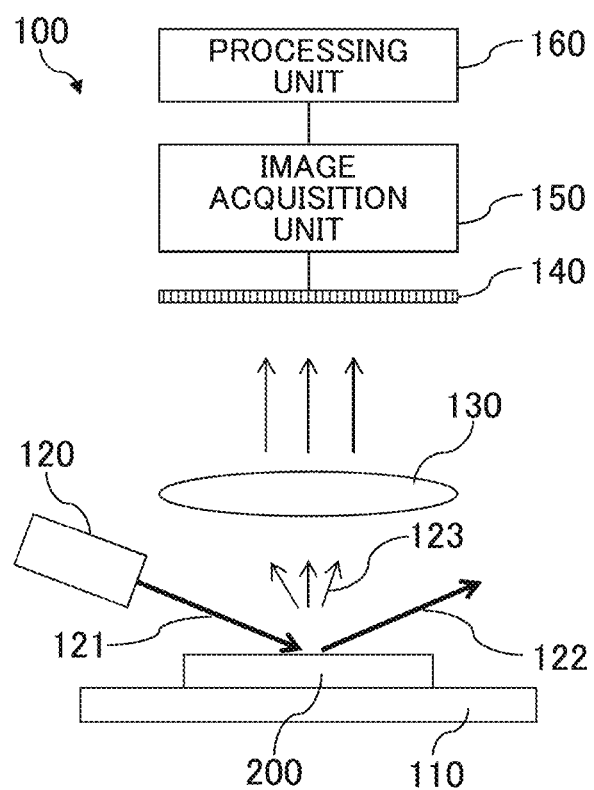
FIG. 1 is a configuration diagram of an inspection device according to an embodiment 1.

FIG. 1 is a configuration diagram of an inspection device 100 according to the embodiment 1 of the present invention. Chips (dies) are present on a wafer 200. A circuit pattern of a semiconductor chip is transferred to the wafer by using a reticle.

The inspection device 100 is equipped with a stage 110, a light source 120, an optical lens 130, a camera (sensor) 140, an image acquisition unit 150, a processing unit 160. The image acquisition unit 150 and the processing unit 160 can be configured as, for example, software which is implemented on a computer and can be also configured by hardware such as a circuit device and so forth which implements functions of them.

The inspection device 100 has the stage 110 on which the wafer 200 is placed. The stage 110 can move the wafer 200 at least in a planar direction (an XY direction).

The light source 120 of the inspection device 100 radiates light 121 to the wafer 200 from above or from diagonally above. When the light 121 shines on the wafer 200, reflected light 122 and scattered light 123 (both are signal light) are generated from the wafer 200.

The optical lens 130 directs the reflected light 122 or the scattered light 123 toward an image pick-up face of the camera (the sensor) 140. The camera (the sensor) 140 picks up an image of the reflected light 122 or the scattered light 123. An inspection device which performs an inspection by picking up the image of the reflected light 122 is called a bright field inspection device and an inspection which performs the inspection by picking up the image of the scattered light 123 is called a dark field inspection. In a case where the wafer has a fixed-cycle repetitive pattern, a space filter which cuts the light which corresponds to the cycle of the repetitive pattern may be installed and the optical lenses 130 may be disposed in front of and behind it.

The image acquisition unit 150 acquires an image of the wafer 200 by using an image pickup signal that the camera (the sensor) 140 acquires. A case which is based on the scattered light from the wafer is called a dark field image and a case which is based on the regularly reflected light from the wafer is called a bright field image. The dark field image can acquire the image in a time which is shorter than that of the bright field image.

The processing unit 160 extracts a reticle-induced repeated defect by using the swath image that the image acquisition unit 150 acquires. The reticle-induced repeated defect is a defect which is transferred to the wafer by being induced by a defect that a reticle itself which is used when transferring a pattern onto the wafer 200 has. A specific decision procedure will be described later. The image acquisition unit 150 and the processing unit 160 may be configured integrally. In the following, for the convenience of description, description will be made by establishing a distinction therebetween.

The light 121 is radiated from the light source 120 to the wafer 200. When it is Linear illumination light, it is wider than point illumination light in one scan width and therefore the image can be acquired therefrom faster. The stage 110 is moved and thereby a position to which the light 121 is radiated on a front face of the wafer 200 is scanned. The stage is scanned by radiating the linear light 121 from the light source 120 and thereby a swath-shaped image which strides over a plurality of dies can be acquired.

A circuit pattern is formed on each die on the front face of the wafer 200. The respective dies have the same circuit patterns.

Figure 3:
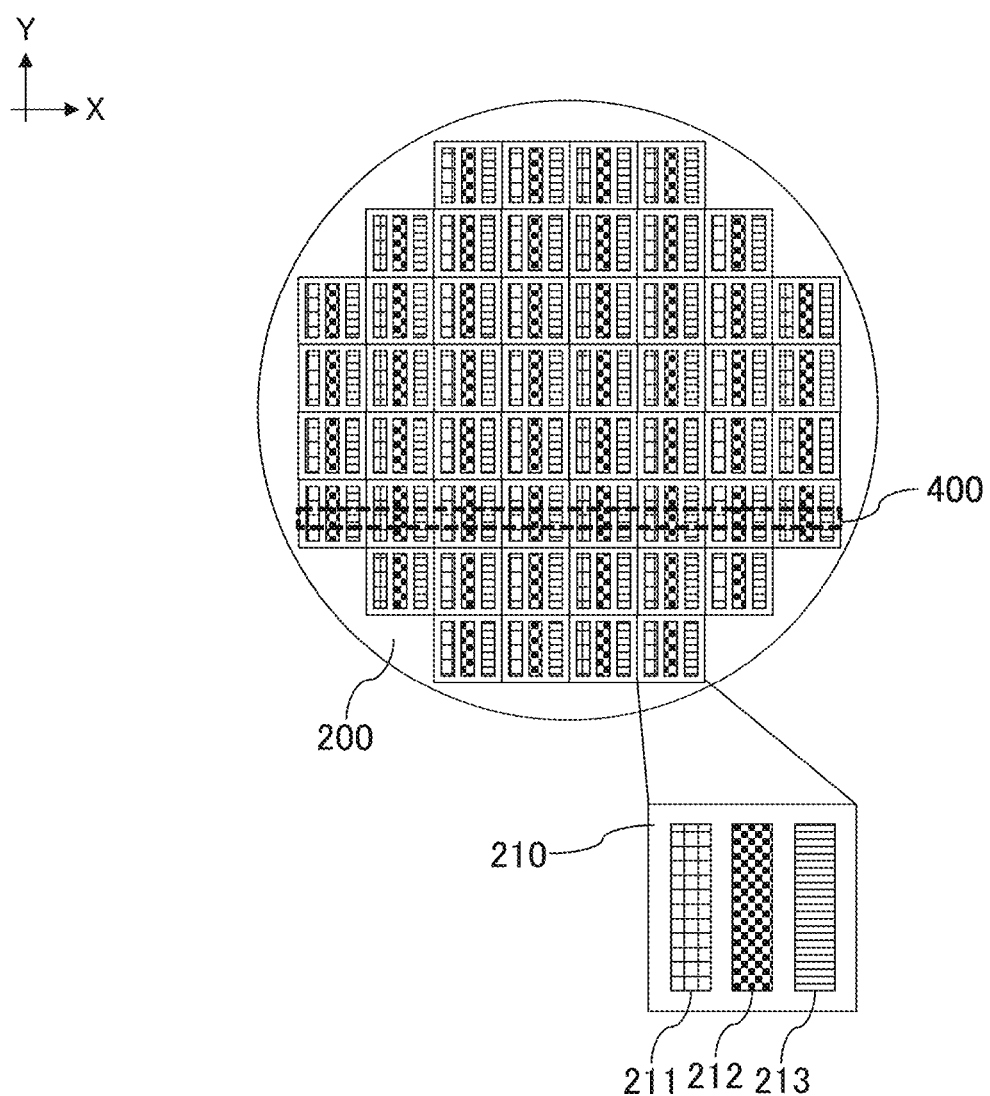
FIG. 3 is a plan view schematically illustrating an inspection wafer.

A one-time transfer unit of the reticle is called a shot. As for the reticle, there is a case where one shot has the patterns for the plurality of dies and there is a case where one shot has the pattern for one die. In a case where one shot has the patterns for the plurality of dies, a plurality of chips (dies) can be formed by one-time transfer. In FIG. 3, an example that three dies 211 to 213 are formed in a region (a shot region) 120 which is transferred in one shot is illustrated.

The stage 110 is moved while radiating the light 121 from the light source 120. On this occasion, an original raw image which is obtained by the camera (the sensor) 140 by scanning on the wafer in one direction by one column is one swath image 400. The image acquisition unit 150 divides the swath image 400 which is obtained from the wafer into die widths. This is a die image.

Figure 2:
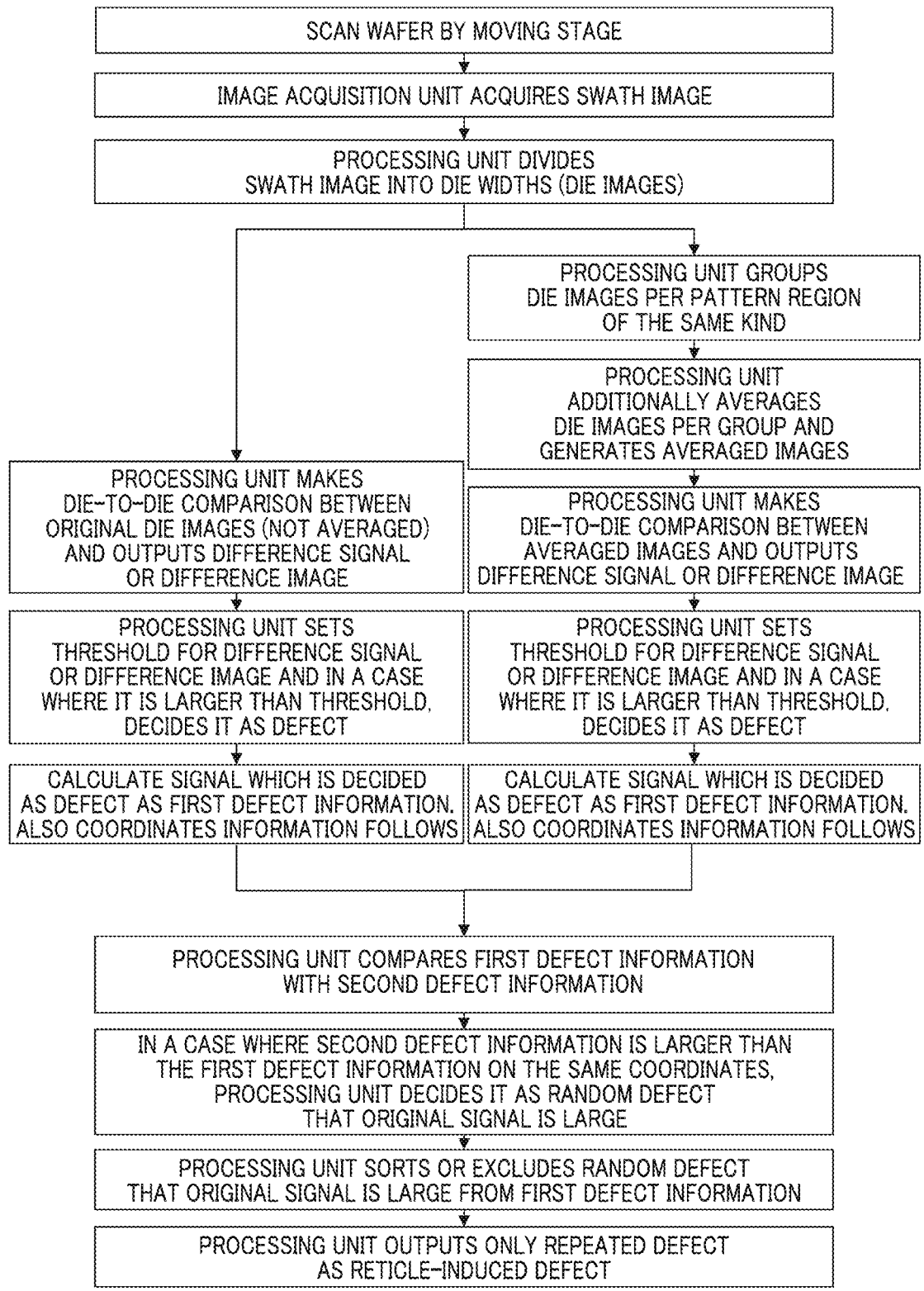
FIG. 2 illustrates a flowchart pertaining to the embodiment 1.

A flowchart pertaining to the present embodiment 1 is illustrated in FIG. 2. As previously described, the inspection device 100 scans the wafer by moving the stage 110 while radiating the illumination light and picks up an image of light from the wafer by the camera (the sensor) 140. Thereby, the image acquisition unit 150 acquires the swath image 400. In a case of wishing to inspect the entire surface of the wafer 200, a swath image of the entire surface is acquired. The processing unit 160 divides the swath image into the die widths. The processing unit 160 executes the following two kinds of processing on this die image. First processing is basic processing for repeated defect detection. Second processing is processing for segregating a random defect which is large in signal amount such as a huge particle and so forth which has the possibility of being left by being decided as a defect still in the first processing from the repeated defect and for sorting a result of detection only to the repeated defect.

The first processing will be described. First, the processing unit 160 groups together the plurality of dies (the details will be described later). Then, it executes averaging processing on the die images per die group. The processing unit 160 generates an averaged die image per die group. Also, an inspection die is included in averaging. The processing unit 160 performs die-To-die comparison between the averaged die images, sets a threshold for a difference signal (a difference image) therebetween and makes a defect decision.

In the die-To-die comparison between the averaged images, Signal/Noise (hereinafter, referred to as S/N) of a signal of the repeated defect becomes larger than that of the random defect. In die-To-die, the comparison is performed in units of pixels, when additively averaging the repeated defects which are present exactly at the same positions, only noise is lowered and Signal is emphasized. As a result, the S/N is heightened (the details will be described later). On the other hand, in the random defect, Signal and Noise are lowered similarly by the averaging processing. In a case of viewing them in terms of a pixel level, since it never happens that the random defects generate exactly at the same positions in the dies, the random defect is lowered also in Signal by the averaging processing. The S/N of the random defect is lowered. Accordingly, there is such an effect that the S/N of the repeated defect is more emphasized than that of the random defect by the averaging processing. The threshold is set conforming with the repeated defect the S/N of which is heightened by the averaging processing.

In the present invention that it is wished to extract only the repeated defect, it is good as long as the repeated defect is not overlooked in the die-To-die comparison between the averaged images and therefore a small random defect may not be extracted even when it is a true defect. An S/N value of such an extent that some random defects are not detected in the random defects can be set as the threshold. The random defect of a weak signal is cut even when it is the true defect and, on the other hand, also a noise rate can be more lowered. It is the opposite to a hot threshold used for detecting potential defects and defects that is set intentionally at or substantially near the noise floor of the images generated by the scanning. The threshold can be strictly set by specializing to the S/N of the repeated defect to be detected in the defect candidates. The threshold can be set in a direction that it becomes from an ordinary threshold to a so-called Cold threshold. Threshold setting in a state of more reducing the noise is possible.

The processing unit 160 identifies a signal the S/N value of which is higher than the threshold as a defect and a signal the S/N value of which is lower than the threshold as a noise using a difference signal by the die-To-die comparison between the averaged die images. Incidentally, in the averaged die-To-die comparison, a difference image may be generated in place of the difference signal. Whether it is the defect or the noise may be decided with the threshold on the basis of the difference image. As to information which is decided as the defect, the processing unit 160 calculates a signal amount thereof or a difference signal amount (a threshold margin) between it and the threshold as first defect information. In addition, also coordinate information on that defect follows the first defect information.

In the first processing, the S/N of the repeated defect is heightened, the S/N of the random defect is lowered, a threshold which conforms to the S/N of the repeated defect is set and repeated defect extraction is performed by the averaging processing. However, in the random defects, there exists a defect which is remarkably high in original Signal in comparison with other defects such as, for example, the huge particle and so forth. In this case, there are cases where even when Signal is lowered by the averaging processing, the S/N exceeds the threshold and it is decided as a defect in the first processing. In the present invention that it is wished to extract the repeated defect, it is necessary to remove this. Therefore, there exists the second processing.

The second processing will be described. Incidentally, the processing unit 160 may execute first any of the first processing and the second processing and may execute them in parallel. The processing unit 160 divides the swath image into the die widths and thereafter executes die-To-die comparison processing also on the original die images which are not averaged. The processing unit 160 sets a threshold for a difference signal or a difference image which is obtained by that die-To-die comparison processing. On this occasion, the threshold may be Cold threshold. Since the result of the second processing is used for discriminating the random defect which is very high in original Signal such as the huge particle and so forth from the result of the first processing, it is good as long as such a random defect which is large in signal can be detected. Accordingly, in the die-To-die comparison between the not averaged die images, the random defect which is small in signal is not intentionally detected even when it is the true defect and a threshold which is more reduced in noise can be set.

The processing unit 160 identifies a signal which is higher than the threshold as a defect and a signal which is lower than the threshold as a noise in the original die images which are not averaged. A method of performing it by generating the difference image may be also used. As to the information which is decided as the defect, the processing unit 160 calculates a signal amount thereof or a difference signal amount between it and the threshold (the threshold margin) as second defect information. In addition, also coordinate information on that defect follows the second defect information.

Next, the processing unit 160 executes processing of further narrowing down only to the repeated defect from the first defect information. It is the processing of sorting out the random defect which is obtained in the second defect information and is originally strong in Signal from the first defect information and removing it. The processing unit 160 compares the first defect information which is obtained by the die-To-die comparison between the averaged images with the second defect information which is obtained by the die-To-die comparison between the not averaged die images. In a case where the first defect information is larger than the second defect information in the defects on the same coordinates, the processing unit 160 decides it as the repeated defect. In the first and second defect information, comparison between either the signal amounts or the threshold margins may be performed. It can be said that the larger the threshold margin is, the more defectiveness is emphasized. Then, the processing unit 160 outputs the defect information that it decides as the repeated defect as a result of inspection.

Processing of extracting only the repeated defect may be a method of subtracting signal intensity of the second defect information from that of the first defect information and magnitude comparison between the signal amounts. The random defect is larger in the second defect information which is obtained by the not averaged and original die-To-die comparison than in the first defect information which is obtained by the die-To-die comparison between the averaged die images. The one which is larger in the original Signal such as the huge particle and so forth becomes larger in Signal reduction rate by the averaging processing. Accordingly, when the signal amount of the first defect information is decreased relative to the signal amount of the second defect information in excess of a predetermined amount in comparison between the first defect information and the second defect information, it can be decided as the random defect whose removal from the first defect information is wished. In addition, in the not averaged and original die-To-die comparison, the random defect which is large in Signal such as the huge particle and so forth is detected more defectively (larger in the difference amount between it and the threshold). Accordingly, a method of deciding the one which is large in the threshold margin of the second defect information relative to the threshold margin of the first defect information as the random defect and removing it from first defect information is also good. The repeated defect 220 may be extracted by comparing the first defect information with the second defect information or sorting out the random defect candidate signal in this way.

Figure 4A:
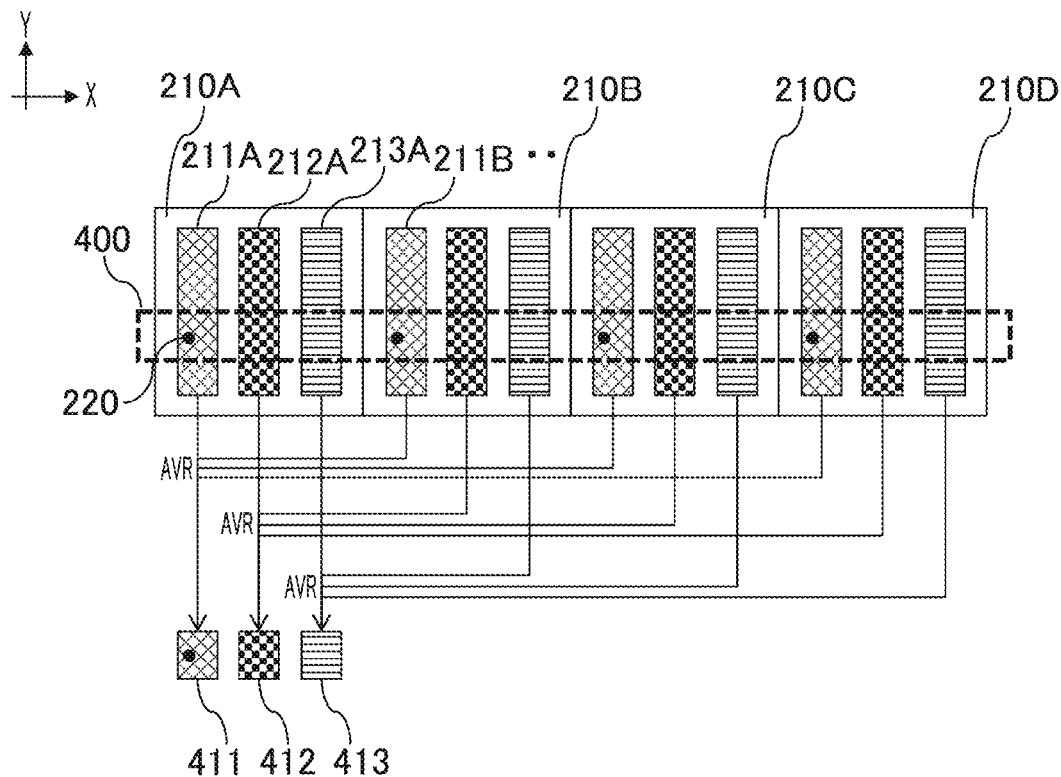
FIG. 4A is a diagram describing a case where a processing unit performs averaging processing on a swath image.

The flow of repeated defect extraction will be described in more detail. FIG. 4A is a diagram describing a case where the processing unit 160 performs the averaging processing on the swath image. Here, an example that four shots 210 are transferred in succession in an X direction is illustrated. Subscripts A to D are added for distinction among the respective shots 210. Also, the corresponding subscripts A to D are added to the respective dies 211, 212 and 213 in each shot 210. It is supposed that the die 211 has the repeated defect 220 which is induced by the defect that the reticle has in FIG. 4A. Accordingly, the dies 211A to 211D have the repeated defects 220 at the same positions in the dies.

In FIG. 4A, it is supposed that the image acquisition unit 150 acquires the swath image 400 which includes the repeated defects 220. In FIG. 4A, an example that the reticle that three dies (for example, 211A, 212A and 213A) are set as one shot 210 is transferred is illustrated. FIG. 4A is a wafer that the reticles in each of which transfer regions for three dies are arrayed in the X direction in one reticle are sequentially transferred in the X direction. When the reticles are transferred in units of three dies in one shot, the same parts (the same transfer regions) of the reticles are transferred in units of three dies. For example, in 211A, 211B, 211C and 211D in FIG. 4A, the same transfer regions are transferred. Accordingly, when there is a defect in the reticle itself, the repeated defect 220 is transferred to exactly the same positions of the dies in units of three dies on the transferred wafer. In FIG. 4A, since the scanning direction of the inspection device 100 is the X direction which is the same as the direction that the reticle transfer regions are arrayed, images of three dies (211A, 212A, 212CA) that the different transfer regions are transferred are included in one swath 400.

The processing unit 160 groups together the die images that the same parts (the same transfer regions) of the reticle are transferred in the die images that the image acquisition unit 150 divides the swath image into die widths. For example, in FIG. 4A, the dies 211A, 211B, 211C and 211D are put together as one group. The processing unit 160 performs grouping processing with reference to such information that how many dies are included in one shot, sizes of the shot and the dies, whether the reticle transfer direction is the same as the scanning direction of the inspection device 100 and so forth. The processing unit 160 executes the averaging processing of the die images per group and generates the averaged die image per group that the transfer regions are same as one another. The grouping and the averaging processing are performed in a state of including the inspection die. The averaging processing is performed by including the inspection die so as to generate the images to be subjected to the later described die-To-die comparison. A noise level can be more lowered and a higher S/N value can be obtained when performing the die-To-die comparison by using the images which are averaged including the inspection die than when performing the die-To-die comparison by using reference images which are averaged without including the inspection die. In FIG. 4A, the averaging processing is executed in the group of 211A, 211B, 211C and 211D that the same transfer regions are transferred to generate an averaged image 411. The processing unit 160 generates images 412, 413 which are respectively averaged also for the dies 212, 213 similarly. The processing unit 160 executes the averaging processing directly on the swath images that the image acquisition unit 150 acquires in this way.

The processing unit 160 performs the die-To-die comparison on the averaged die images 411 to 413. In a case where the reticle has a defect, that defect generates at intervals which are the same as those of reticle one-shot transfer and therefore is detected at the same positions of all the shots 210A to 210D.

Figure 5A:
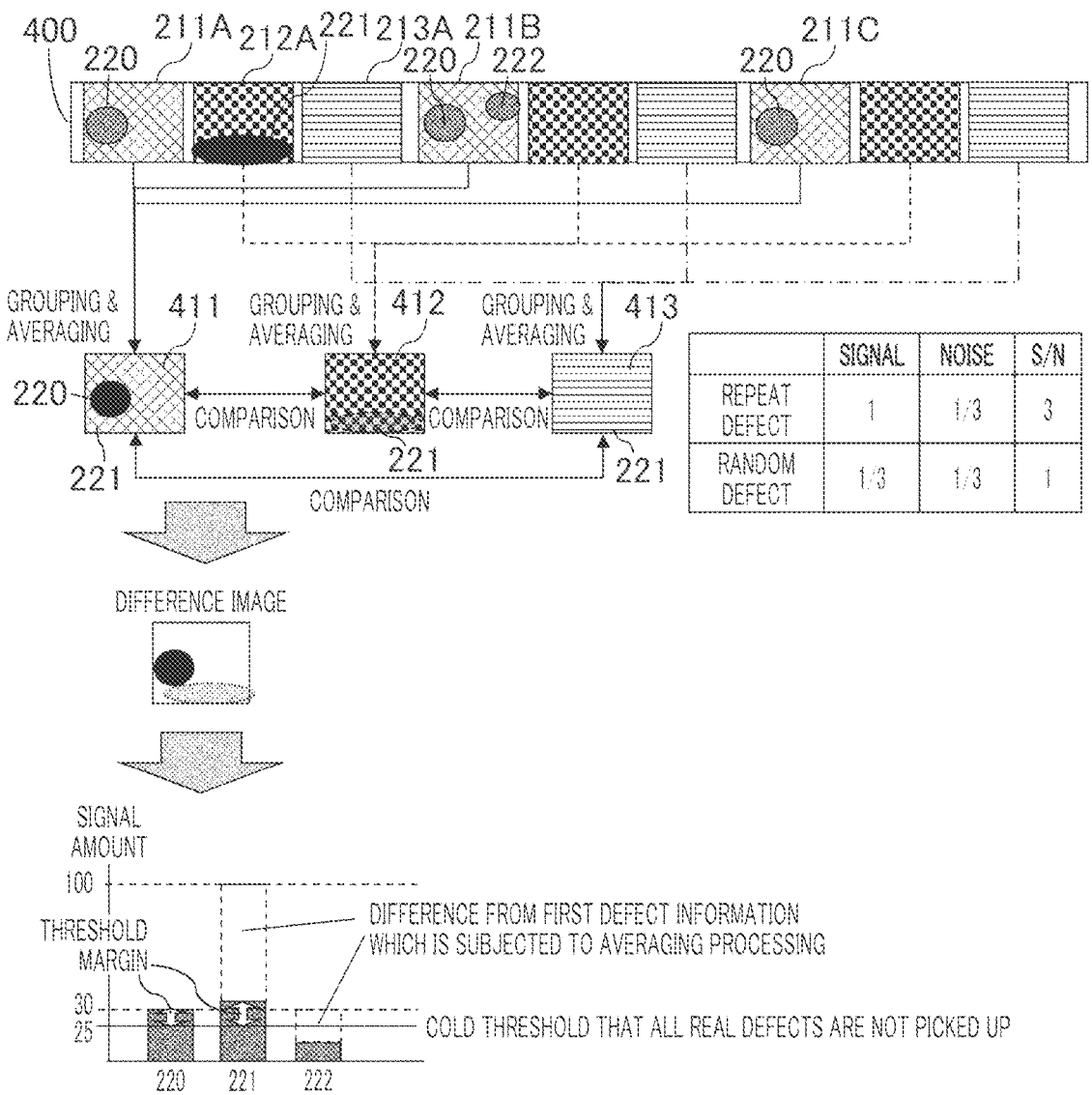
FIG. 5A is a diagram describing a flow of a case where the processing unit performs the averaging processing on a swath image.

FIG. 5A is a diagram describing a flow of a case where the processing unit performs the averaging processing on the swath image. First, the processing unit 160 performs grouping in units of dies which have the same transfer regions as described above. It executes the averaging processing of the die images which are grouped together including the inspection die. Then, it executes the die-To-die comparison of the averaged die images 411 to 413 so as to calculate the difference signal. Also, the difference image may be output. For example, it is supposed that the repeated defect 220 is present in the dies 211A, 211B and 211C on the same parts in the dies. It is supposed that random defects 221, 222 are present also in this swath. When the three dies 211A, 211B and 211C are grouped together and the averaging processing is performed in units of pixels, Signal of the repeated defect which is present in the same places in the dies becomes 1. On the other hand, the random defect is present in irregular arrangement in each of the dies which are grouped together. When the averaging processing is performed in units of pixels, Signal of the random defect is not definitely present on the same positions and therefore is lowered to ⅓. For example, the random defect 222 is included only in the die 211B in 211A, 211B, 211C and therefore Signal is lowered to ⅓ in the course of performing addition and averaging for three dies. Since the noise levels are equal to each other when averaged both in the repeated defect and the random defect, when comparing them with each other in the S/N value, the repeated defect reaches three times as large as the random defect. Even in a case of the random defect 221 that the original signal amount is very large, Signal is lowered similarly by the averaging processing. When the processing unit 160 performs the die-To-die comparison between the averaged images by the averaging processing, the S/N of a calculated difference signal becomes large in the case of the repeated defect and becomes small in the random defect.

However, as illustrated in FIG. 5A, it is difficult to set a threshold for distinguishing between a repeated defect 220 and the random defect 221 that the original Signal is large. The S/N of the repeated defect 220 is more emphasized than that of the random defect by averaging and a threshold which is optimum to that S/N is set. However, the random defect 221 that the original Signal is large still exceeds this threshold even when Signal is decreased by averaging and there is the possibility that it would be decided as the defect. Accordingly, a result of decision of the die-To-die comparison between the not averaged die images which is described in FIG. 5B becomes necessary.

The processing unit 160 sets a threshold for the difference signal which is obtained from the die-To-die comparison between the averaged die images. On this occasion, the threshold is set conforming with the reticle defect signal which is the repeated defect that the S/N becomes high by averaging. Therefore, although the random defect is the true defect, it is not necessary to detect it. Accordingly, Threshold which is more Cold than usual can be set. In a case where it is higher than the set threshold, the processing unit 160 decides it as the defect candidate. The processing unit 160 calculates the signal amount or the threshold margin of the coordinate of the defect which is decided as the defect candidate as the first defect information. The defect coordinate also follows the defect information.

Figure 4B:
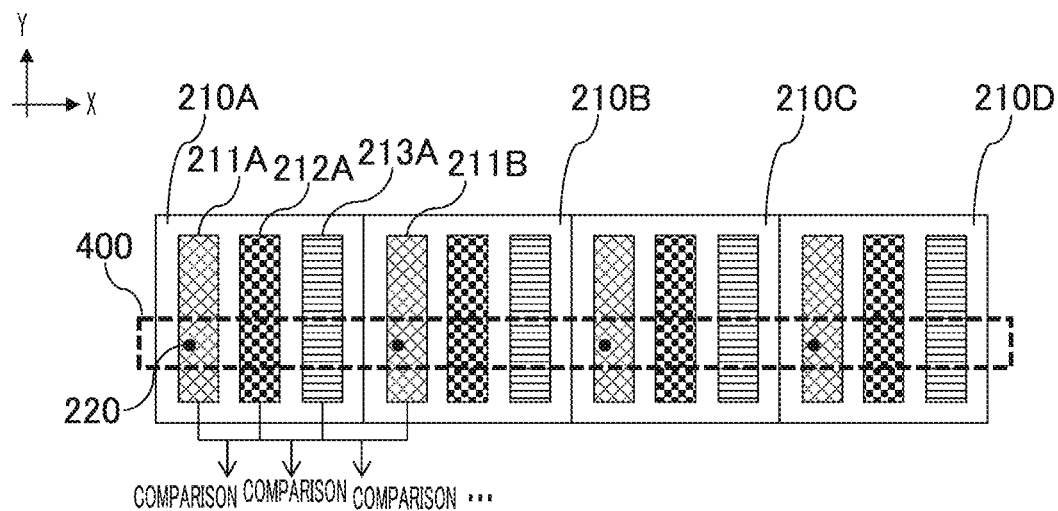
FIG. 4B is a diagram describing a case where the processing unit performs die-To-die comparison that no averaging processing is performed.

FIG. 4B is a diagram describing a case where the processing unit performs the die-To-die comparison that the averaging processing is not performed. The processing unit 160 carries out procedures which are described in FIG. 4B and FIG. 5B in addition to the procedures which are described in FIG. 4A and FIG. 5A. The aim thereof is to sort out or exclude the random defect which is large in signal amount such as the huge particle and so forth from the result of detection. The processing unit 160 divides the swath image 400 in units of dies and thereafter sequentially compares the adjacent die images with each other. It calculates the difference signal (may be the difference image) which is obtained by sequentially performing the die-To-die comparison thereof with the adjacent die. The processing unit 160 decides that a part which becomes more than the threshold is the defect for that difference signal. In the example which is illustrated in FIG. 4B, the processing unit 160 repeats such die-To-die comparisons that (1) the dies 221A and 212A are compared with each other, (2) the dies 212A and 213A are compared with each other and (3) the dies 213A and 211B are compared with each other on the entire of the swath image 400.

Figure 5B:
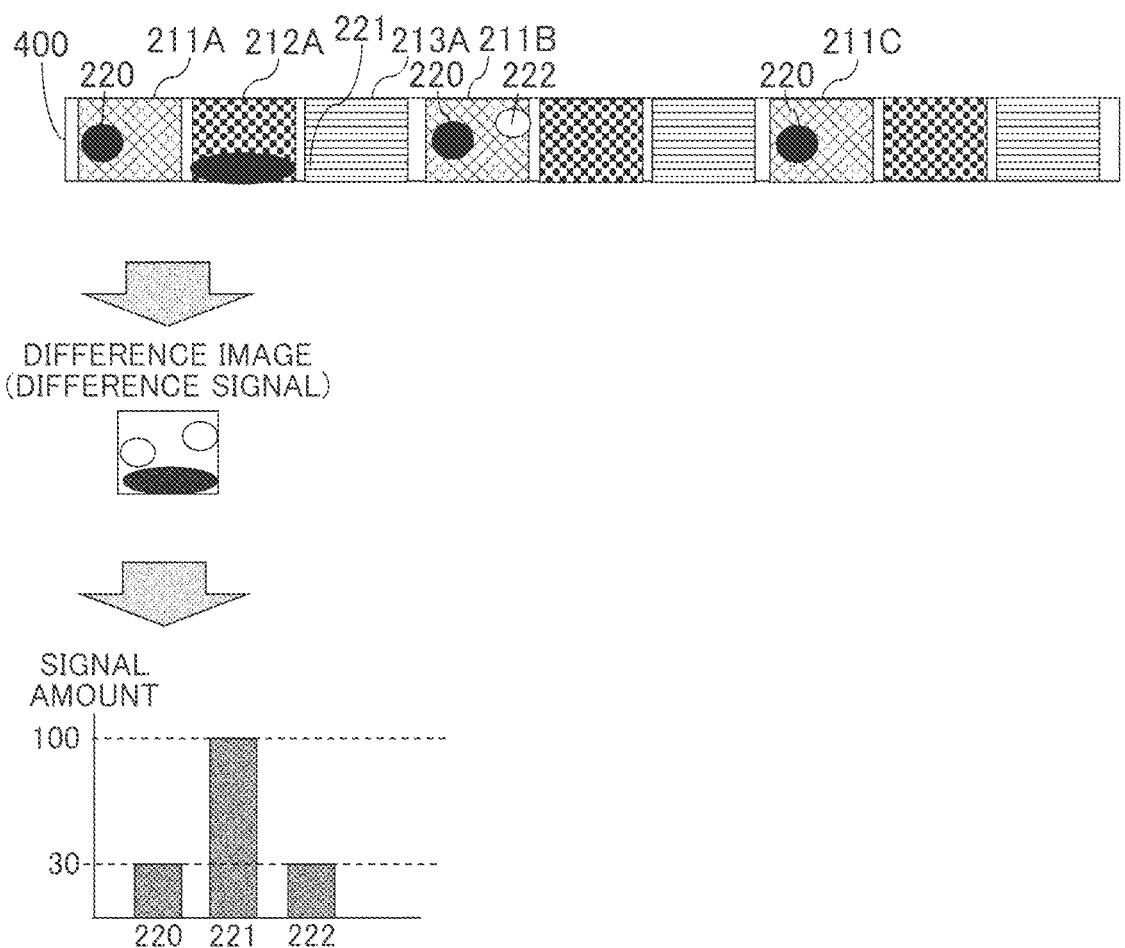
FIG. 5B is a diagram describing a flow of a case where the processing unit 160 performs the die-To-die comparison that the averaging processing is not performed on the swath image.

FIG. 5B is a diagram describing a flow of a case where the processing unit 160 performs the die-To-die comparison that the averaging processing is not performed on the swath image. That is, the die-To-Die comparison between the original die images which are not averaged is described. The processing unit 160 executes the die-To-die comparison on all the dies in one swath 400 and outputs the difference signals (the difference images). The processing unit 160 sets the threshold for the difference signals and divides them into defect signals and noise signals. The aim thereof is to sort out or to exclude the random defect which is large in signal amount such as the huge particle and so forth from the first defect information and therefore the random defect which is large in signal amount such as the huge particle and so forth may only be detected even when it is the true defect. Accordingly, also the threshold in that case may be Cold Threshold of such an extent that only the defect which is large in the signal amount can be detected even when it is the true defect. The processing unit 160 calculates the signal amount of the coordinates of the defect which is decided as the defect candidate or the difference signal amount (the threshold margin) for the threshold as the second defect information. Also, the defect coordinates follow the defect information.

As in FIG. 4B and FIG. 5B, in a case where three dies 211, 212 and 213 are present in one shot 210, there is no generation of the defects at positions which are exactly the same as each other of the adjacent dies. Accordingly, in the ordinary die-To-die comparison between the adjacent dies, no large difference occurs in S/N as to whether the repeated defect or the random defect. The processing unit 160 mutually compares the signal amounts or the threshold margins of the first defect information in a case of performing the averaging processing and the second defect information in a case of performing no averaging, and in a case where the first defect information is larger, decides it as the repeated defect which is induced by the reticle defect.

As in FIG. 4A and FIG. 5A, the processing unit 160 groups the swath image in units of dies to which the same transfer regions are transferred, and in a case of the repeated defect in the die-To-die comparison between the images which are averaged in each group, the S/N value is heightened. As in FIG. 4B and FIG. 5B, in a case where the processing unit 160 does not average the swath images and performs the ordinary die-To-die comparison thereon, such an effect does not occur. That is, when the averaged die images 411 to 413 are mutually compared, the S/N rate of the repeated defect can be heightened and the repeated defect can be detected highly sensitively. In addition, in the S/N of the defect which is obtained by the die-To-die comparison between the averaged die images and the S/N of the defect which is obtained by the die-To-die comparison which is not averaged and is original, the difference is noticeably exhibited more in the repeated defect and the random defect which is large in signal amount such as the huge particle and so forth than in others. Accordingly, the random defects are further removed from the first defect information by using the second defect information which is obtained by the die-To-die comparison which is not averaged and is original and thereby the repeated defect can be accurately detected.

Effects of the present embodiment will be described. First, in the point that the wafer that the reticle is transferred is inspected and thereby the reticle-induced defect can be extracted, such an issue that it will become difficult to inspect the reticle itself hereafter because of further refinement and material change can be solved. In addition, since the wafer is inspected by the optical inspection device after the reticle has been transferred thereto, inspected can be performed at a higher speed than in a case of inspecting the wafer by other inspection systems using electron beams and so forth. Full surface inspection is also possible. In addition, since only the repeated defect is output in a result of inspection to be output, there is no need to distinct between it and the random defect visually and therefore it is efficient. In addition, in the present invention, such processing that all the true defects which include fine random defects are once extracted by the hot threshold system is not performed in the course of extraction of the repeated defect. Therefore, there is no need to temporarily store defect candidate information which includes many noises and there is no need to care about a memory capacity.

Figure 6:
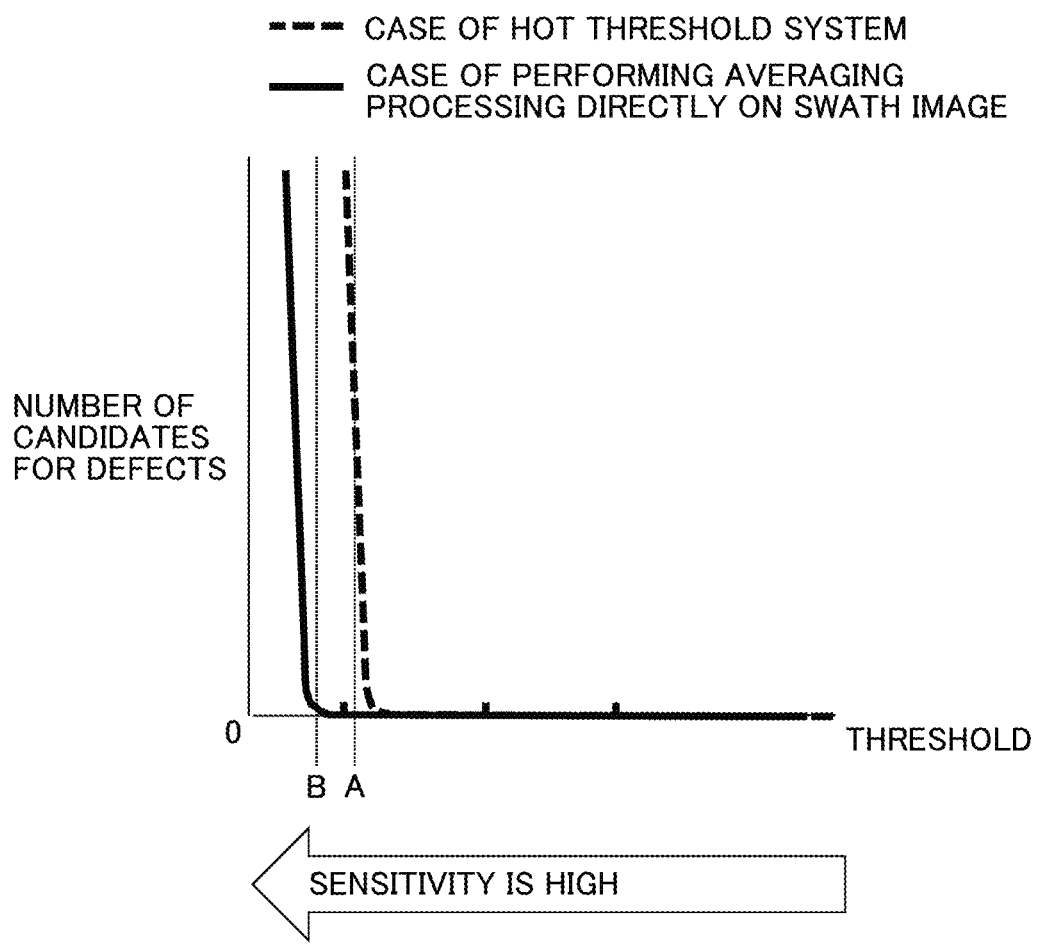
FIG. 6 is a diagram describing a difference between a hot threshold system and a reticle defect inspection of the present invention.

A relation between threshold setting and repeated defect detection sensitivity will be concretely described using FIG. 6. The hot threshold system which is disclosed in the prior art is set as a comparative example. A relation between the number of defect candidates and the sensitivity which is obtained in the comparative example is indicated by a curve A (a broken line). Although the true defects are also included in the defect candidates in a region which is high in sensitivity, most of them are noise-induced false information. In a case of the comparative example, since a defect in the noise region or its near part is intentionally detected, many noises are included with a threshold which is lower than a line that the number of defect candidates is jumpingly increased. However, since the noises are jumpingly increased in this region, there is a limitation because of data capacity constraint. In the comparative example, the defect candidates are acquired with a threshold A and the repeated defect is extracted by image comparison and the averaging processing which are performed thereon.

On the other hand, in the present invention, the averaging processing is performed directly on the swath images that the image acquisition unit acquires. The noise level itself is lowered by the averaging. Therefore, the relation between the number of defect candidates and the sensitivity is indicated by a curve B (a solid line). The S/N rate of the repeated defect extraction of which is the most wished is heightened by the averaging processing. This is because the noise level is lowered by the averaging and only Signal of the repeated defect extraction of which is wished is emphasized. A threshold B is set conforming to a state where the noise level is lowered by the averaging and also the S/N of the repeated defect is more increased. The noise level itself becomes lower than that of the comparative example by performing the averaging processing directly on the swath images, and in the case of the threshold B of the present invention, even when Cold Threshold is set, detection of the repeated defect can be performed at a sensitivity which is higher than that of the comparative example. In addition, that Cold Threshold can be set, the number of defect candidates which is induced by the noise is exceedingly smaller than that with A and most of them are true defects. Further, since there is no need to care about data capacity limitation, repeated defect detection can be performed with the sensitivity B which is higher than A in sensitivity. In addition, there is no need to conduct classification of the repeated defects and the random defects on a huge amount of defect candidate information as in the comparative example. This is because objects from which the repeated defect is extracted are less than those in the comparative example and therefore a processing time can be more shortened. Only the repeated defect can be detected at sensitivity and speed which are higher than conventionally attained ones in a more noise-reduced state in the final inspection result.

One example of a method of calculating the first or second defect information will be shown. For example, when images are compared with each other, the larger Signal of the difference signal (or the difference image) is relative to the noise, the higher the possibility that it is the true defect is. In a case where noise amounts are calculated and averaged in advance, a theoretical noise amount can be calculated. Therefore, a threshold which is appropriate for each of them is calculated and thereby a difference signal amount to the threshold when performing thresholding processing on the difference signal (or the difference image) can be also set as the defect information. In addition, a signal amount of a difference to a fixed threshold of the difference signal can be also set as the defect information. In a case where the first defect information is higher than the second defect information, the processing unit 160 decides it as the repeated defect which is induced by the defect that the reticle has.

The repeated defect extraction method may be also a method of performing extraction without using the second defect information, other than a method of making a decision by comparing the first defect information with the second defect information. First, in the not-averaged swath images, the processing unit 160 acquires the signal of the random defect on the basis of the difference signal which is obtained from the ordinary die-To-die comparison. Then, the processing unit 160 may perform processing of excluding this random defect signal from the die-To-die comparison between the averaged images.

The processing unit 160 outputs information on the detected repeated defect. For example, an image, coordinates, a die number, a shot number and so forth of the repeated defect can output. As output destinations, for example, to display a screen on a display of a computer which loads the processing unit 160 or to output data that each piece of information is described to an upper system which manages the inspection device and so forth are conceived of.

A first modified example of the embodiment 1 will be described. It is an example that the die-To-die comparison is performed using the averaged die images and thereafter the not-averaged and original die-To-die comparison is performed by narrowing down objects. In FIG. 4A, the processing unit 160 performs the die-To-die comparison using the averaged die images on the swath image and calculates the first defect information. In this first defect information, the not-averaged ordinary die-To-Die comparison in FIG. 4B is performed only on the image of the coordinate which is decided as the defect and is extracted in the first defect information. Then, the second defect information which is decided as the defect is calculated. Only the repeated defect is extracted on the basis of a difference between the first defect information and the second defect information. According to the present modified example, there is no need to process all the images which are detected in the processing in FIG. 4B and the processing time can be shortened. Incidentally, in the present embodiment that the second processing is executed only on the one which is decided as the defect by the averaging processing, since the signal of the fine random defect becomes smaller on the averaged image, it is easily to be excluded from the defect candidates, in particular, with Cold Threshold. In addition, in place of the defect decision in FIG. 4B, the repeated defect may be extracted by such statistical processing that a distribution of images which are used for averaging is arithmetically operated and the one which is large in distribution is decided as the random defect and so forth.

A second modified example of the embodiment 1 will be described. The same result can be obtained also by not dividing the swath image die by die, but dividing the swath image shot by shot and executing shot-To-shot comparison.

Figure 7A:
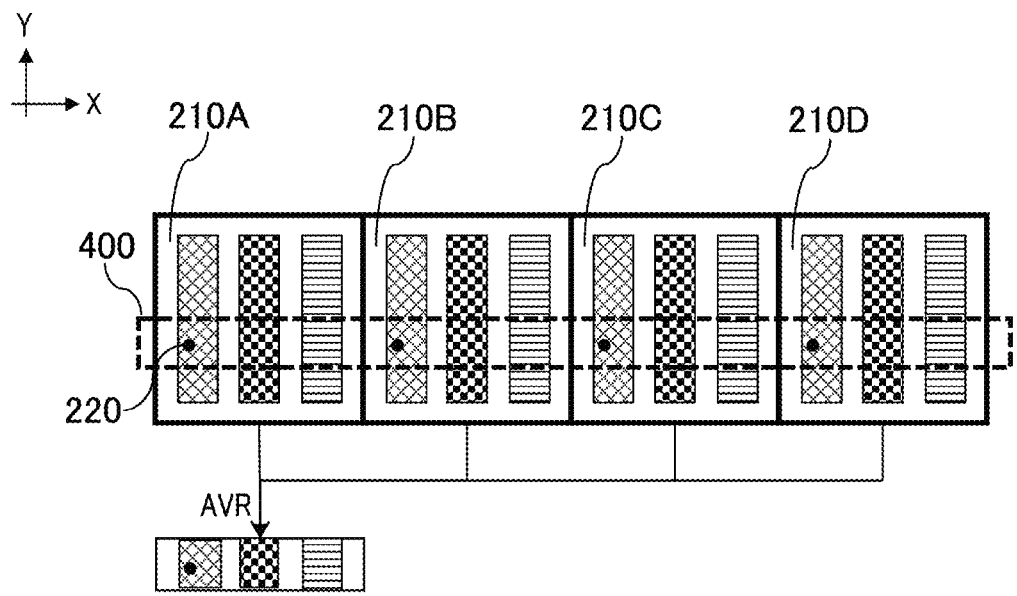
FIG. 7A is a diagram describing a procedure that the processing unit 160 decides presence/absence of the reticle defect.
Figure 7B:
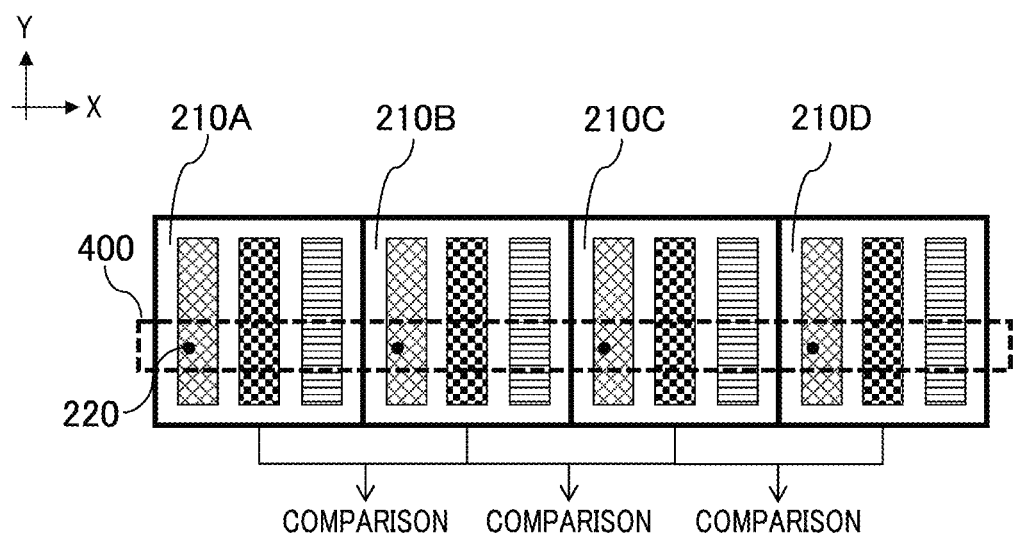
FIG. 7B is a diagram describing a procedure that the processing unit 160 decides presence/absence of the reticle defect.

The processing unit 160 divides the swath image that the image acquisition unit 150 acquires shot by shot. As illustrated in FIG. 7A, the processing unit 160 executes processing of averaging the respective shot images of one swath 400. Thereby, a shot image 410 which is averaged in units of shots is generated for every one swash. The processing unit 160 executes the shot-To-shot comparison using the image 410 which is averaged in units of shots. Then, it executes thresholding processing on a difference signal (or a difference image) thereof and extracts the first defect information. Likewise, as illustrated in FIG. 7B, the processing unit 160 divides also a swath image which is not averaged and is original shot by shot and thereafter performs the shot-To-shot comparison between adjacent shots. Then, the processing unit 160 executes the thresholding processing on a difference signal (or a difference image) thereof and extracts the second defect information. The processing unit 160 compares the first defect information with the second defect information and extracts only the repeated defect. The method of extracting the repeated defect by using the first defect information and the second defect information is as described before.

Figure 8:
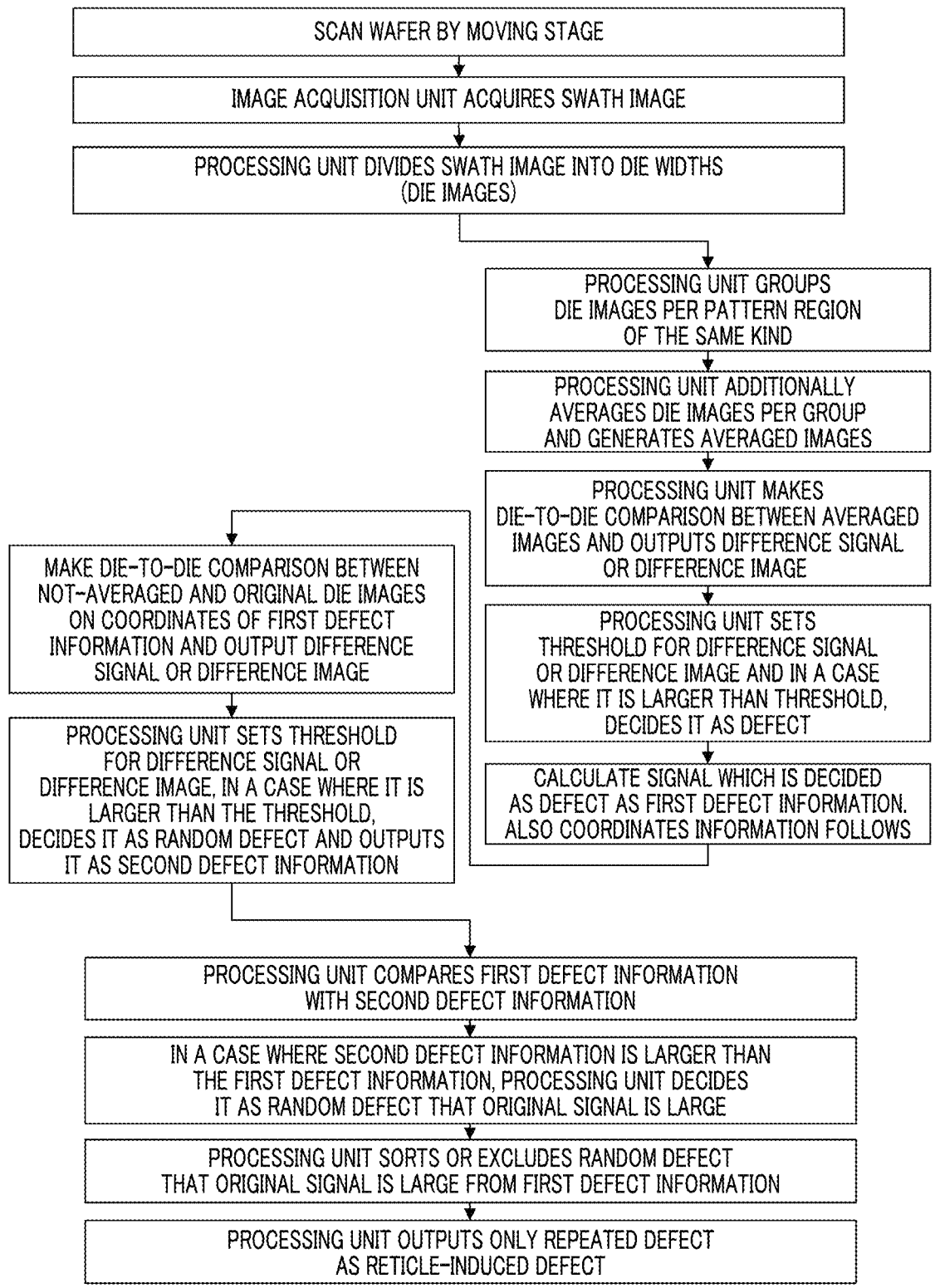
FIG. 8 is a modified example of the flowchart pertaining to the embodiment 1.

In addition, similarly to the first modified example, in the ordinary comparison between the adjacent shots of the not-averaged swath image in FIG. 7B, defect decision may be performed only on the coordinate of the one which is decided as the defect in the comparison between the images which are averaged in units of shots in FIG. 7A and thereby the repeated defect may be extracted on the basis of a difference between the both defect information. Also, in this case, the effect which is the same as that of the first modified example is obtained. According to the present modified example, in the processing in FIG. 4B, the repeated defects are compared with each other, a threshold margin which indicates defectiveness becomes an extremely small value and decision of the repeated defect is more stabilized. In this case, a sequence in FIG. 2 is altered as illustrated in FIG. 8.

Embodiment 2

Figure 9A:
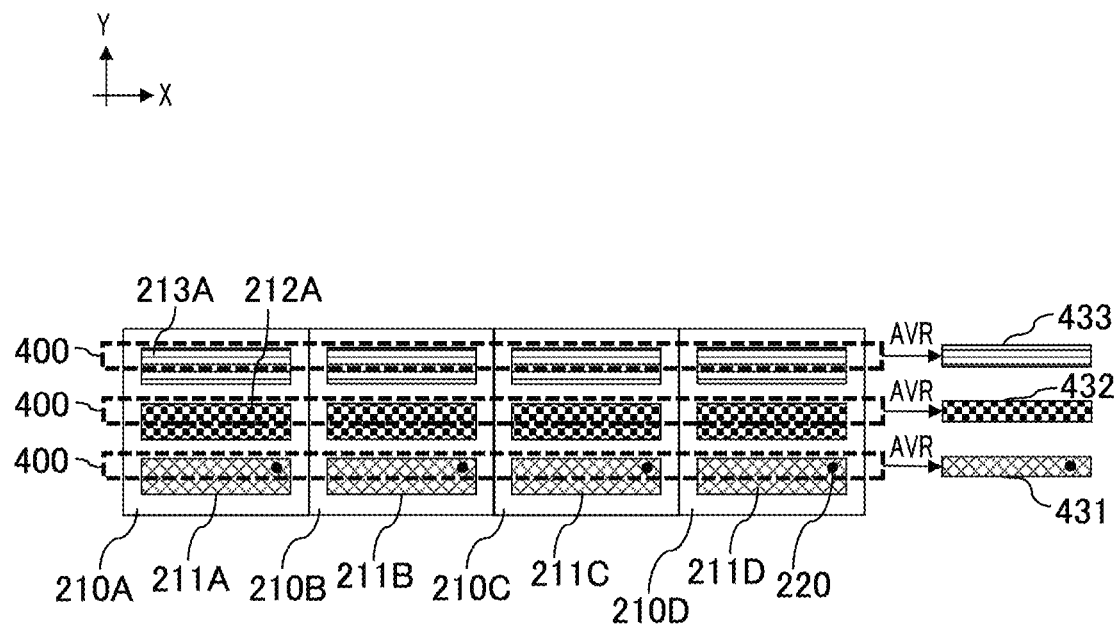
FIG. 9A is a diagram describing a procedure that the processing unit 160 decides presence/absence of the reticle defect.
Figure 9B:
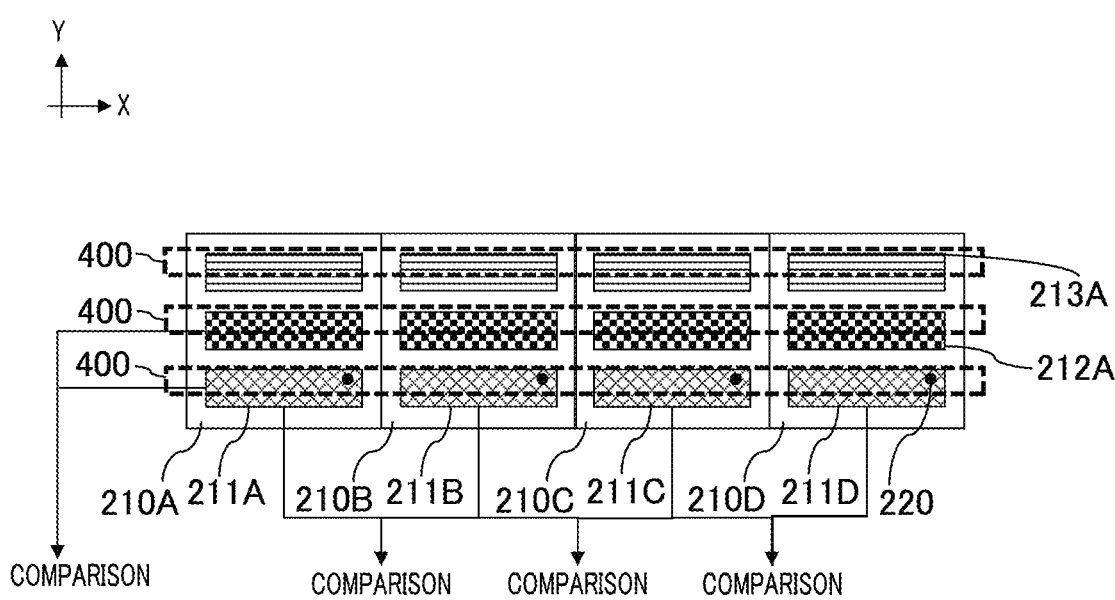
FIG. 9B is a diagram describing a procedure that the processing unit 160 decides presence/absence of the reticle defect.

Also, in the embodiment 2, the stage 110 is moved in the X direction while radiating the light 121 from the light source 120. As illustrated in FIG. 9A, an image which is obtained by scanning one column in the X direction is set as one swath image 400. In addition, also in the embodiment 2, it is supposed that one shot of the reticle has patterns for the plurality of dies. However, the embodiment 2 supposes that arrangement of dies which have different transfer regions in one shot is the Y direction as illustrated in FIG. 9A. The same parts (the same transfer regions) of the reticle are transferred to the dies 211A, 211B, 211C. The same applies to 212A, 212B, 212C. An arrangement direction of the dies of the different transfer regions in the shot and a direction that the inspection device 100 scan mutually intersect. Therefore, in one swath image, the same transfer regions in the shot are transferred to the adjacent dies.

Figure 10A:
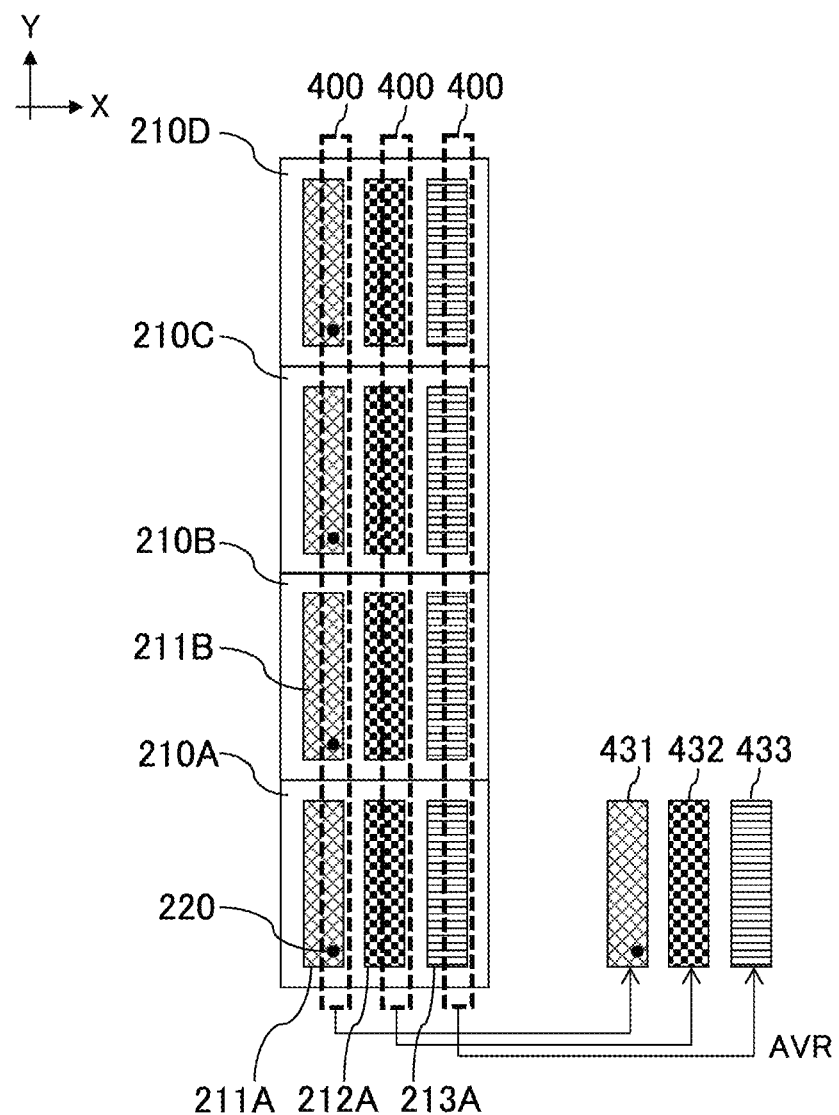
FIG. 10A is a diagram describing a procedure that the processing unit 160 decides presence/absence of the reticle defect.
Figure 10B:
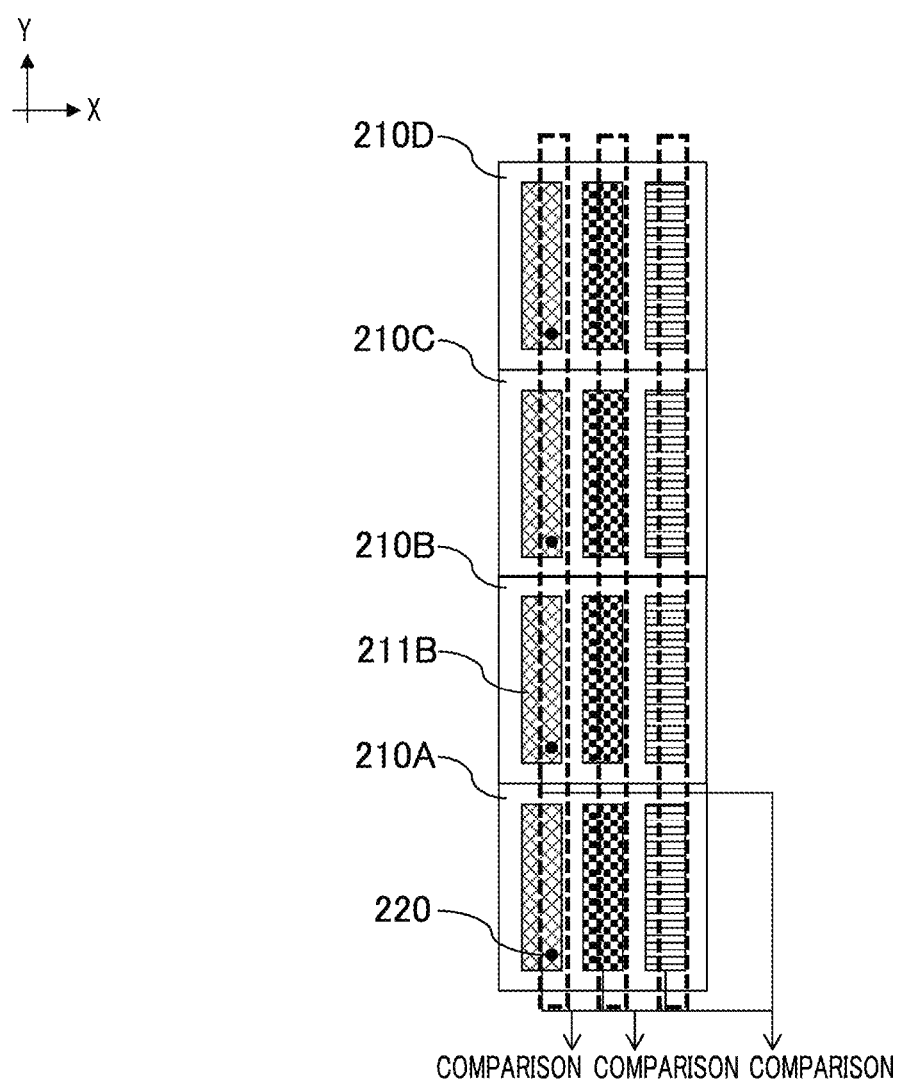
FIG. 10B is a diagram describing a procedure that the processing unit 160 decides presence/absence of the reticle defect.

In addition, as illustrated in FIG. 10A and FIG. 10B, the same also applies to a case where while the inspection device 100 scans in the Y direction and obtains one swath image, arrangement of the dies which have the different transfer regions in the shot is the X direction.

In the embodiment 1, the processing unit 160 acquired one swath image, divided it into the die widths and executed the grouping and the averaging processing in units of dies of the same transfer regions in the swath. Since the plurality of dies which have the different transfer regions were present in one swath, it could generate the plurality of averaged die images only in one swath. However, in the embodiment 2, there are many cases where only the dies of the same transfer regions are present in one swath. Therefore, in the embodiment 2, the processing unit 160 obtains images that dies of the different transfer regions are averaged from the plurality of swaths and subjects them to the die-To-die comparison. In FIG. 9A, in one swath 400 which includes the dies 211A, 211B, 211C, the processing unit 160 generates an image 431 that these are averaged. Likewise, the processing unit 160 generates an image 432 that 212A, 212B, 212C are averaged in another swath 400. Likewise, it generates 433 that dies 213A, 213B, 213C are averaged in another swath 400. Then, the processing unit 160 executes the die-To-die comparison using the averaged images 431, 432, 433. Then, processing up to extraction of the reticle defect is the same as that in the embodiment 1.

As a modified example of the embodiment 2, the same processing can be executed by replacing the die with the shot. The processing unit 160 may execute a method of generating averaged images from the plurality of swath images in units of shots and performing the shot-To-shot comparison between the images which are averaged in units of shots. In a case of performing the shot-To-shot comparison between the averaged shot images, the processing unit 160 executes the comparison in shot-To-shot also on not averaged swath images.

When comparing with the embodiment 1, since the images which are averaged are acquired from a plurality of swath images 421 to 423, the S/N rate of a defective part is more improved by performing the die-To-die or shot-To-shot comparison by using it.

Embodiment 3

In the embodiments 1 to 2, the example that the patterns for the plurality of dies are transferred by one-time transferring using the reticle was described. In the embodiment 3 of the present invention, an example of a case where a pattern of one die is transferred by one-time transferring which uses the reticle will be described. It is an example of one shot one die.

Figure 11A:
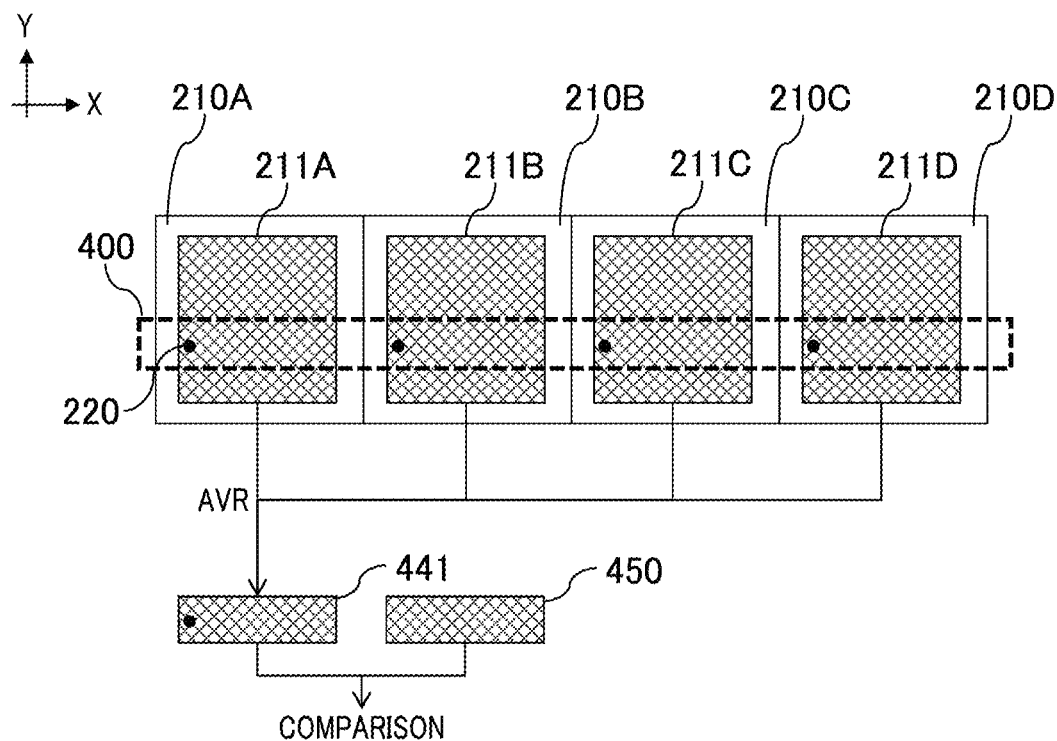
FIG. 11A is a diagram describing a procedure that the processing unit 160 decides presence/absence of the reticle defect.

FIG. 11A is a diagram describing a procedure that the processing unit 160 decides presence/absence of the reticle defect. The swath image 400 moves the stage in the X direction while radiating the light 121 from the light source 120 and obtains one swath image similarly to the embodiment 1. The plurality of shots is included in one swath 400. Dies to which the same transfer regions of the shots are transferred are repeated in one swath. The processing unit 160 divides one swath die by die.

Figure 11B:
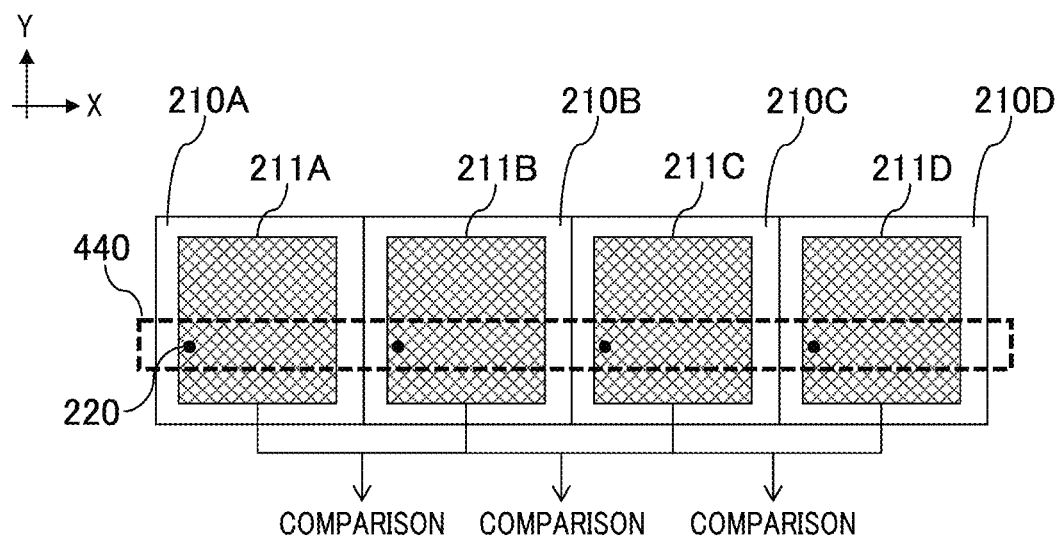
FIG. 11B is a diagram describing a procedure that the processing unit 160 decides presence/absence of the reticle defect.

As illustrated in FIG. 11B, the processing unit 160 performs the die-To-die comparison thereof with the adjacent die on the original die images which are not averaged similarly to the embodiments 1 to 2. It executes the thresholding processing on the difference signal (the difference image) thereof and calculates the second defect information.

The processing unit 160 performs the averaging processing on die images that the swath image is divided die by die and generates an averaged die image 441. In the embodiments 1-2, the images which are used for the die-To-die comparison between the averaged die images are acquired in the same wafer. However, in the embodiment 3, a reference image which is used in the die-To-die comparison between the averaged die images is obtained in advance from another wafer. It performs the averaging processing in the same way by using swath images which are obtained in advance from another wafer that patterns are transferred from another reticle (however, confined to a one shot one die reticle) and generates an averaged die image 450, and the processing unit 160 stores this into a memory and so forth (not illustrated) which is installed therein. The processing unit 160 performs the die-To-die comparison using this and the averaged die image 441 of the inspection wafer 200. Then, it executes the thresholding processing on the difference signal (the difference image) thereof and calculates the first defect information.

The method of extracting the reticle-induced repeated defect by using the first defect information and the second defect information is the same as that in the embodiment 1.

The reference image 450 can be prepared in advance by acquiring an image of a die that the pattern is formed using another reticle. However, for example, there are cases where the defect is present also on another reticle which is used for generation of the reference image and it is necessary to distinguish whether it is the repeated defect on an inspection die or the repeated defect on the reference image. In this case, whether the defect is the repeated defect which is present on either the reference image or an inspection object wafer can not be specified simply by image and signal intensities. In general, in a case of the inspection device which detects scattered light, the difference signal (the difference image) is obtained by subtracting the reference image from the inspection object image and therefore it has a characteristic that a defective part of the inspection object image has a large signal amount. Accordingly, it can be decided that the defect is present on the part which is large in the signal amount. In addition, the defect can be specified as a common part by using two kinds of the reference images or two kinds of observation patterns.

Incidentally, although description is made in regard to the die image, it may be a shot image.

Modified Examples of the Present Invention

The present invention is not limited to the aforementioned embodiments and various modified examples are included. For example, the above-mentioned embodiments are described in detail for ready understanding of the present invention and are not necessarily limited to the one which includes all the described configurations. In addition, it is possible to replace part of a configuration of one embodiment with a configuration of another embodiment and it is also possible to add a configuration of another embodiment to a configuration of one embodiment. In addition, it is possible to add/delete/replace another configuration to/from/ with part of one configuration of each embodiment.

In the above embodiments, although the semiconductor wafer and the semiconductor chips which are formed thereon are exemplified as an example of the wafer 200 that the inspection device 100 inspects, the inspection device 100 according to the present invention can be used for other substrates as long as the pattern is transferred by using the reticle.

Although in the above embodiments, that the stage 110 moves thereby to scan the position to which the light 121 is radiated was described, the radiation position may be scanned by refracting the light 121 by using an appropriate optical system. Further, these may be combined together.

REFERENCE SIGNS LIST

100: inspection device
110: stage
120: light source
130: optical lens
140: camera (sensor)
150: image acquisition unit
160: processing unit
200: wafer
210: transfer region
211 to 213: semiconductor chip (die)

The invention claimed is:

1. In reticle defect detection systems,
an inspection sub-system which detects a repeated defect as a reticle defect from a swath image that a wafter to which a reticle is transferred is imaged, a reticle defect detection system comprising:
a stage which holds the wafer and moves in an XY direction;
an image acquirer which acquires the swath image by scanning the wafer; and
a processor which performs arithmetic processing on the swath image, wherein
the processor divides the swath image into die images,
additively averages die images of the same transfer regions that the same parts of the reticle in the swath image are transferred and generates averaged images,
calculates first defect information which is obtained by performing die-TO-die comparison between the averaged images,
calculates second defect information which is obtained by performing die-TO-die comparison between original die images which are not averaged in the swath image, and
compares the first defect information with the second defect information on the same coordinates and extracts only the repeated defect by sorting out or excluding a case where the second defect information is large.

2. The reticle defect detection system according to claim 1, wherein
the defect information is a defect signal amount or a threshold margin.

3. The reticle defect detection system according to claim 2, wherein
the averaged images are a first averaged image which is acquired from the wafer and a second averaged image which is acquired, in advance, from a second wafer to which a reticle which is different from the reticle which is transferred to the wafer is transferred, and
a die-TO-die comparison is made between the first averaged image and the second averaged image and thereby the first defect information is calculated.

4. The reticle defect detection system according to claim 3, wherein
the wafer and the second wafer are wafers to which a one-shot one-die reticle is transferred.

5. The reticle defect detection system according to claim 4, wherein
in a case where a defect is present also on the reticle which is transferred to the second wafer,
the processor obtains a difference that the second averaged image is subtracted from the first averaged image, and
in a case where it is larger than a threshold, calculates it as first defect information.

6. The reticle defect detection system according to claim 1, wherein
the same processing is performed by replacing the die with a shot.

7. The reticle defect detection system according to claim 2, wherein
a threshold when extracting the second defect information is Cold Threshold.

8. The reticle defect detection system according to claim 7, wherein
the second defect information is a signal amount or a threshold margin of a random defect of a huge particle and so forth which is particularly high in Signal/Noise in random defects.

9. The reticle defect detection system according to claim 1, wherein
the averaged images are images which are generated by being additively averaged including an inspection die.

10. The reticle defect detection system according to claim 1, wherein
an optical reticle defect detection system which has
a light source which radiates light to the wafer, and
a sensor which detects the light which is generated from the wafer.

* * * * *